United States Patent [19]

Bergman et al.

[11] Patent Number: 4,556,471
[45] Date of Patent: Dec. 3, 1985

[54] PHYSICAL VAPOR DEPOSITION APPARATUS

[75] Inventors: Clark Bergman, Roseville; Gary E. Vergason, Minneapolis, both of Minn.; William Allen, River Falls, Wis.; Michael F. Reed, Coon Rapids, Minn.

[73] Assignee: Multi-Arc Vacuum Systems Inc., St. Paul, Minn.

[21] Appl. No.: 542,120

[22] Filed: Oct. 14, 1983

[51] Int. Cl.$^4$ ............................................. C23C 13/12
[52] U.S. Cl. .................................. 204/298; 118/733; 118/726; 427/37
[58] Field of Search .............. 118/733, 726, 723, 50.1; 34/242; 49/402, 485; 427/37, 42; 219/121 EE, 121 EL, 121 EN, 121 ET, 138; 373/95; 204/298; 277/194

[56] References Cited

U.S. PATENT DOCUMENTS

| | | | |
|---|---|---|---|
| 3,649,339 | 3/1972 | Smith | 118/733 |
| 3,839,182 | 10/1974 | Sager | 204/298 |
| 4,073,669 | 2/1978 | Heinecke et al. | 204/298 X |
| 4,333,962 | 6/1982 | Pulker et al. | 427/37 |
| 4,412,196 | 11/1968 | Figgins | 219/121 EL |
| 4,448,149 | 5/1984 | Brown, Jr. et al. | 118/723 X |
| 4,452,686 | 6/1984 | Axerov et al. | 118/723 X |

OTHER PUBLICATIONS

Roth, *Vacuum Sealing Techniques*, Pergamon Press, Oxford, Eng., 1966, pp. 330, 410 and 411.

*Primary Examiner*—Norman Morgenstern
*Assistant Examiner*—Bernard F. Plantz
*Attorney, Agent, or Firm*—Merchant, Gould, Smith, Edell, Welter & Schmidt

[57] ABSTRACT

An improved electric arc vapor deposition source plate mounting assembly (8) is disclosed. The source plate assembly is formed of a plurality of cooperatively mating sections (12, 22 and 24) that are secured to one another by fastening members (30, 32). The innermost section (24) carries an electrode (26) of coating source material. Insulator seal rings (56, 58) electrically isolate the mating sections (12, 22 and 24) from one another while forming a vacuum seal between the respective mating members. The insulator seal rings (56, 58) have two adjoining sections annularly displaced from one another such that the rings are self-centering between the respective mating members. The insulator rings preferably have a substantially L-shaped cross-section and include an enlarged bulge portion (61) for improved sealing characteristics. The insulator seal members enable the mating components of the source plate assembly to be operatively mounted in close proximity to one another such that coating particles do not contaminate the seal members. A spacer member (53) further protects one of the seal members (58) from wandering cathode spot damage. The source plate assembly (8) includes hinges (14) for enabling ease of maintenance of the assembly and the cathode source (26). The source plate assembly includes a permanent magnet (54) for controlling spot movement, and improved liquid coolant flow paths (23, 64) for cooling the assembly.

21 Claims, 7 Drawing Figures

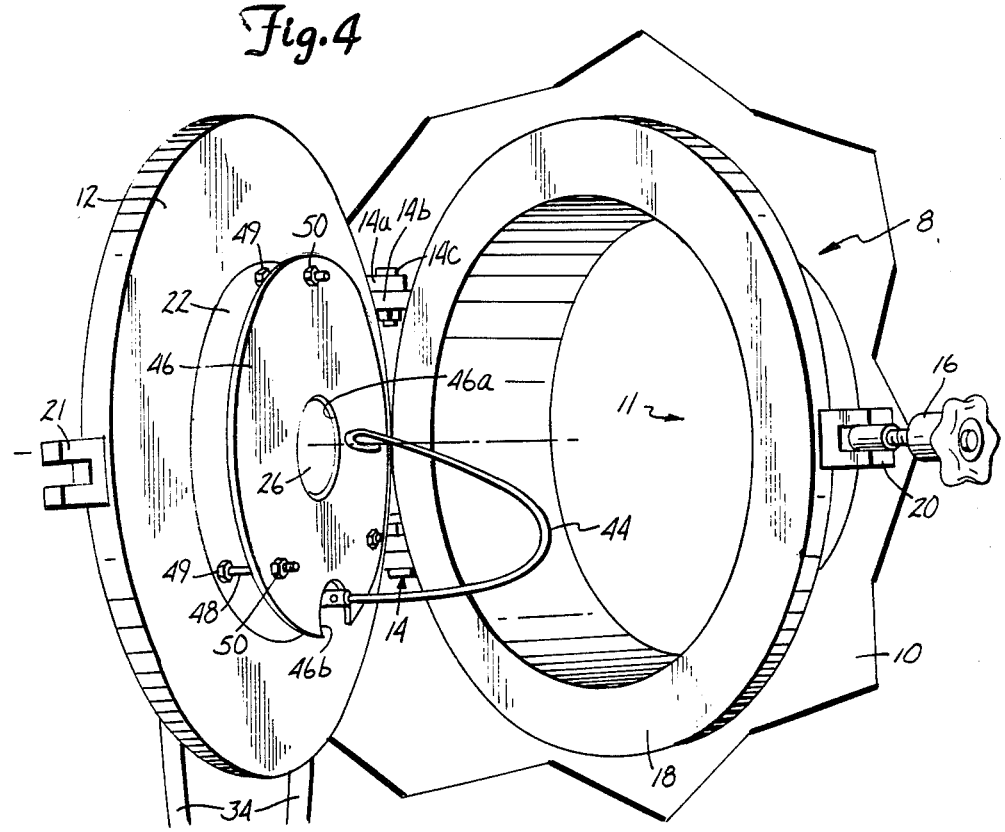
Fig. 4
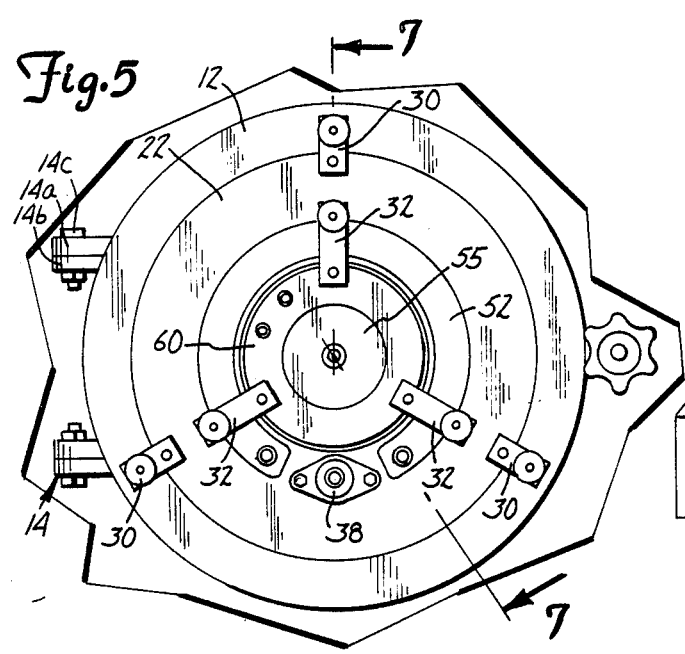
Fig. 5
Fig. 6

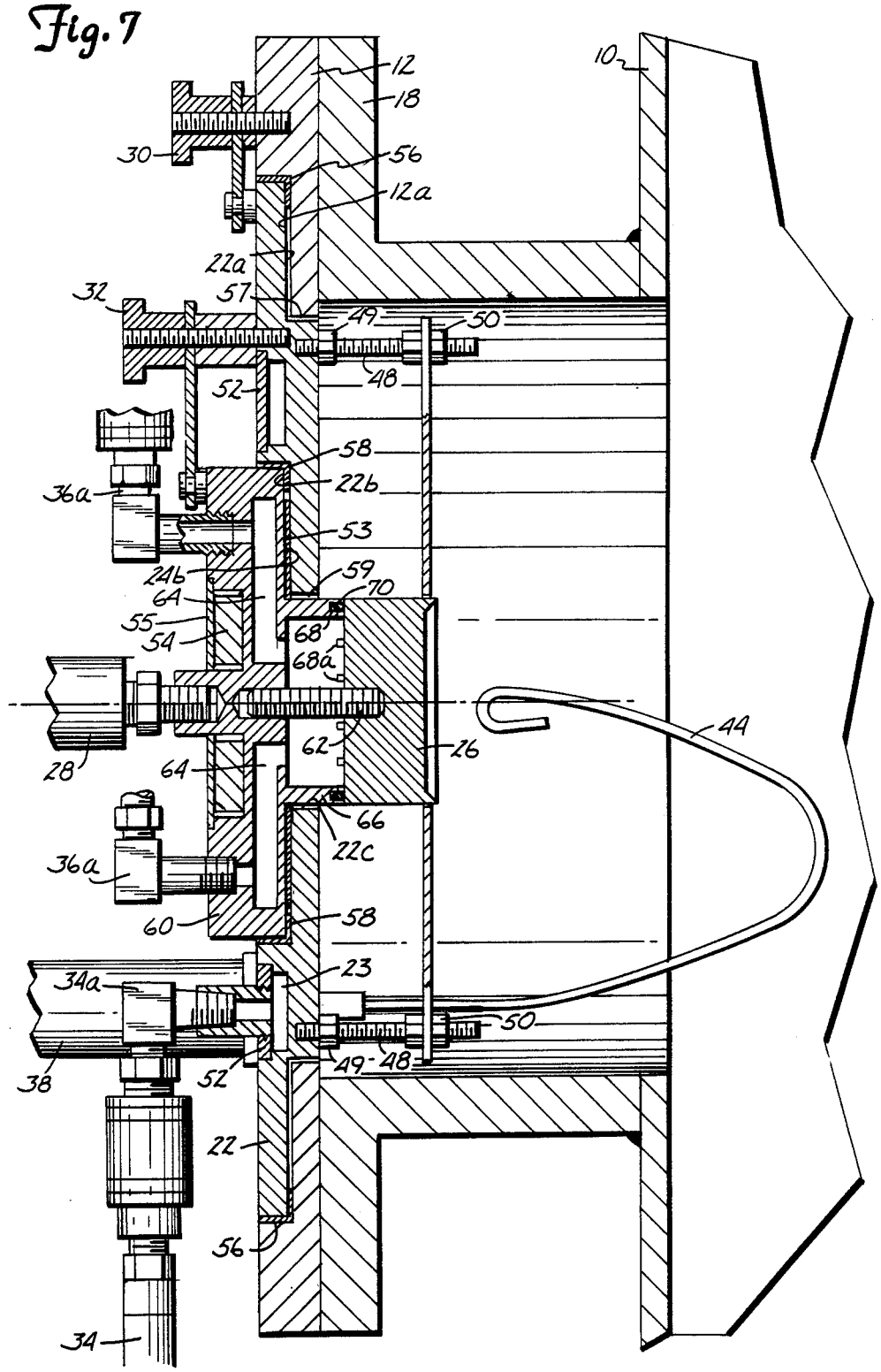

PHYSICAL VAPOR DEPOSITION APPARATUS

FIELD OF INVENTION

The present invention relates generally to physical vapor deposition, and more particularly to an electrode mounting assembly for an electric arc vapor deposition machine.

BACKGROUND OF THE INVENTION

Processes for depositing thin films of various materials on substrates are well known and have been found to be very useful. The processes can be broadly classified into two categories: physical vapor deposition (to which this invention applies) and chemical vapor deposition. As used herein, chemical vapor deposition generally refers to that coating art wherein a plurality of reactive components are introduced into a coating chamber which may or may not be evacuated. The components are caused to chemically react with one another, and the products of the reaction form a film that is coated upon the substrate. Chemical vapor deposition processes can be conducted at various pressures and temperatures.

As used herein, the term physical vapor deposition refers to that coating art wherein at least one of the coating components is initially placed into the coating chamber in a non-gaseous form. The non-gaseous coating component is generally called the "source". The coating chamber is typically evacuated to sub-atmospheric pressure prior to and during the coating process. Sufficient energy is applied to the source material to change it to vapor state, which vapor subsequently comes to rest in film form on the substrate, perhaps after combining with other components. Electrostatic and-/or electromagnetic fields may be used in the process of converting the source material to its vapor phase as well as to direct the coating particles toward the substrate.

There are a number of different physical vapor deposition techniques, which are distinguished in the manner in which the source material is vaporized. One physical vapor deposition technique involves heating the source material in a crucible. The crucible is heated until the contained source material melts and then vaporizes. A related technique involves passing electric current directly through the source material so that the source melts and then vaporizes due to Joule heating. In the latter process, the electrical energy is physically conducted to the source through a metallic conductor, and an arc is not generally created.

Physical vapor deposition techniques also include ionic bombardment and sputtering deposition techniques. With these techniques, the source material is disposed within the coating chamber as a target and is bombarded with accelerated ions. The bombarding ions impart sufficient energy to the source target material to vaporize it.

Still another type of physical vapor deposition technique, and one to which this invention is particularly applicable, is that of electric arc vapor deposition. Here, as opposed to the resistive Joule heating process described above, an arc is intentionally struck, and the electrical energy contained in the art is controlled, to vaporize the source material, thus creating a coating "plasma". The source material is biased at one electric potential within the coating chamber and acts as one electrode (usually the "cathode ") of the electric arc discharge circuit. Another portion of the deposition chamber is biased at a second potential, different from the source potential, and acts as the second electrode (usually the "anode") of the electric arc discharge circuit. An arc-initiating trigger element is positioned proximate to the cathode source and is positively biased with respect to the cathode. The trigger element is momentarily allowed to engage the surface of the cathode material, establishing a current flow path through the trigger and cathode. As the trigger element is removed from engagement with the cathode source, an electrical arc is struck, which is thereafter maintained between the cathode and the anode electrodes of the chamber. In fact, a plurality of such arcs are typically maintained between the two electrodes in an operative electric arc vapor deposition chamber. This electric arc vapor deposition phenomenon is well known, and need not herein be discussed in detail. The electric arc(s) energy is sufficient to vaporize the source material, forming a coating plasma for subsequent deposition onto substrates within the deposition chamber.

One type of coating source material that has been used for the cathode in an electric arc vapor deposition system, is titanium (Ti). When a Ti source material is used, a reactive gas such as nitrogen ($n_2$) is often introduced into the deposition chamber during the vaporization of the Ti source. The nitrogen gas reacts with the Ti to form a coating plasma within the chamber, which comprises Ti, $N_2$, TiN and other such complexes. TiN forms a gold-colored coating that has been found to be a very durable coating for cutting tools and the like.

To assist in describing a physical vapor deposition system, a diagrammatic view illustrating a typical such system, and in particular that of an electric arc physical vapor deposition system, is illustrated in FIG. 1. Referring thereto, the deposition chamber is generally illustrated as a box-like structure. The chamber is typically evacuated (sometimes down to pressures as low as $10^{-6}$ Torr) by an appropriate vacuum pump. The substrate(s) to be coated is placed upon an appropriate substrate holder within the chamber as illustrated, and may be rotated (as illustrated by the rotation arrow) to assist in uniform coating by the coating plasma. The coating source material is appropriately mounted in the chamber so as to operatively address the substrate(s) to be coated. In FIG. 1, three such coating material sources are illustrated (one in the top wall of the chamber and two in each of the side walls of the chamber). The assembly for mounting the coating material source is typically referred to as an "evaporator", and is so designated in FIG. 1. The coating material source of each evaporator, is designed for removal and replacement, and often-times the entire evaporator assembly is configured for removal from the chamber wall. Accordingly, appropriate seals (not illustrated in FIG. 1) must be provided between the evaporator assembly and the chamber wall, and within the evaporator assembly itself, to maintain the vacuum within the deposition chamber. Such seal means form a part of the present invention, and will be discussed in more detail hereinafter. Referring to FIG. 1, an inert gas may be introduced into the deposition chamber to assist in certain phases of the process. In addition, reactive gases such a nitrogen can be introduced into the chamber during the deposition process, as illustrated in the FIGURE by the functional block termed "reactive gas". Generally, in physical vapor deposition processes, and in particular in electric arc vapor deposition processes, many of the plasma particles travel essentially in straight lines (i.e. in a line-of-sight manner) from the coating sources to the substrate(s), as generally illustrated by the straight line patterns of FIG. 1. The substrate(s) may be biased by an appropriate Power Supply, as illustrated, to attract ionic particles of the coating plasma toward the substrate surfaces.

The present invention is directed toward a mounting assembly for a coating material source of a physical vapor deposition chamber, and in particular to such a mounting assembly for a coating material source that acts as an electrode of an electric arc vapor deposition chamber. A typical prior art electrode mounting assembly is diagrammatically illustrated in FIG. 2. It will be understood that the prior art diagram illustrated in FIG. 2 is intended only for the purposes of assisting in explaining the design constraints and problems associated with such mounting structures, and is not intended to provide an exhaustive explanation thereof. In particular, only that portion of a coating material source electrode holder or mounting assembly in which the electrode functions as a cathode of an electric arc vapor deposition chamber, is illustrated. Referring to the figure, the cathode mounting assembly is generally mounted to the deposition chamber wall in a manner such that the chamber wall is electrically isolated from the entire electrode mounting assembly. Such connection may include a non-conductive acrylic ring and non-conductive washers and bushings around the mounting bolts, as illustrated. O-ring seals in combination with the acrylic ring provide a vacuum seal between the chamber wall and the electrode mounting assembly. Such electrode mounting assemblies of the prior art have typically included a mounting plate or ring, sometimes referred to a source plate, which supports a cathode shield structure (hereinafter described) and an inner cathode assembly. The cathode assembly is secured to the source plate by appropriate fastening means (fastener "A"), and is separated from the source plate by a seal, which typically has been in the form of an O-ring in the prior art. The O-ring seal provided both electrical isolation between the source plate and the cathode assembly as well as providing a vacuum seal for the internal deposition chamber. The cathode assembly mounts a replaceable cathode of the coating source material which when operatively mounted addresses the internal deposition chamber, means for cooling the cathode, and means for electrically biasing the cathode. In the apparatus illustrated in FIG. 2, a circulating cooling fluid enters a cooling reservoir through an inlet port and exits through an outlet port. The cathode is secured to and closes the open end of the cooling reservoir by means of a mounting harness and bolt that is fastened to the inner cathode assembly housing near the biasing end of the assembly. In the FIG. 2 illustration, the spacing between the upper cathode surface (and cathode shield) and the source plate is greatly exaggerated, for illustration purposes. The reservoir seal at the cathode end is achieved by an O-ring sandwiched between the cathode's lower surface and the end of the housing. The other end of the reservoir is sealed by means of an end cap threaded to the inner cathode assembly housing and an O-ring disposed between the end cap and the housing. An electrode biasing post or wire is fastened to the reservoir end cap and provides an electrical connection for a power supply for biasing the electrode through the housing and cathode mounting harness. Minimal cooling of the O-ring seal at the reservoir end cap end is provided by perforations through the inner cathode assembly housing adjacent the cathode mounting harness bolt, which allow some cooling fluid to leave the reservoir and engage the end cap and associated O-ring. The cathode assembly also typically includes a magnet, generally in the form of an electromagnet, usually mounted external of the deposition chamber and generally referred to as a "spot coil".

The spot coil provides a magnetic field in relation to the cathode during the deposition process, which causes the cathode spots to more uniformally traverse the upper surface of the cathode source material so that the cathode erodes in fairly uniform fashion during the deposition process. The cathode shield functions to maintain the cathode spots on that surface or face of the cathode which is directed toward the deposition chamber cavity and to prevent them from drifting off of such face and down the sides of the cathode. The cooling fluid is typically water, which is directed toward the rear surface of the cathode, as illustrated. Such cooling is intended to keep the sealing rings cool for preventing heat damage thereto and to minimize formation of droplets or agglomerations of the source material during deposition, to provide a smoother coating of the substrate and to provide material dimension stability for the dissimilar metals of the system.

Though the prior art cathode mounting structure such as represented in FIG. 2 generally serves its intended purpose, it suffers from several drawbacks. One area that has been particularly troublesome with the prior art structure has been with its seal members. In particular, problems have been associated with the acrylic ring and seal member(s) that have been used to isolate the chamber wall from the source plate ring and to seal the interface between the two components. As illustrated in FIG. 2, the inner edge of the insulator ring has typically been directly exposed to the inner cavity of the deposition chamber and has not been sufficiently protected from exposure to the coating plasma. Accordingly, the ring has tended to become coated by the coating plasma, which is typically of electrically conductive material. Such coating thus creates an electrical conductive path across the ring, shorting out its electrical insulation properties. In order to maintain electrical isolation between the chamber wall and the source mounting plate, such ring member has had to be removed and scraped on a regular basis, typically after each deposition run. Such cleaning, besides involving significant effort and time, also gives rise to possible damage to the ring itself during the cleaning process. Further, premature coating of the ring can limit the operative duration of a run.

Similar problems have also existed with the O-ring seal members of prior art structures. While the physical vapor deposition process is generally a line-of-sight process, there are a significant number of atoms and particles of the coating plasma that get by one or two-bounce optical barriers before condensing on a surface. With prior art structures such as illustrated in FIG. 2, the gap between the source plate ring and the inner cathode assembly mounted thereto is generally large enough to allow a significant number of particles to drift through the gap and coat the exposed surface of the O-ring seal therebetween. If a significant number of such particles coat the O-ring seal, a conductive path can be established across the seal, as was the case with the acrylic ring member. Since the inner cathode assembly and the source plate are biased at different electrical potentials, the conductive path thus formed across the O-ring destroys the electrical isolation between the two assemblies. Further, on occasion the cathode spot drifts off of the face of the cathode and past the cathode shield. Such drifting cathode spots readily move down the slide of the cathode and the cathode mounting assembly and to the O-ring, itself, burning and damaging the O-ring and its sealing properties. Another problem with such O-ring structures of the prior art is that they are generally not self-centering. Such O-rings must be maneuvered and deformed so as to precisely register with the O-ring groove before they can be forced into the groove. Once forced into the groove, the O-ring preferably remains in the groove while the cathode assembly is positioned and secured to the source plate mounting ring. Typically, such cathode mounting assemblies are disposed such that the source plate is oriented in a vertical plane. If the O-ring groove is made deep enough so as to adequately house the O-ring so that it will remain in place during the cathode assembly positioning process, there is a high likelihood that the O-ring will collapse under the mounting pressure such that the cathode assembly comes into electrical contact with the source plate ring. On the other hand, if the O-ring groove is made too shallow, the O-ring has a tendency to fall out of the groove during the positioning process.

Still another drawback of such prior art electrode mounting assemblies relates to the construction of the electromagnet or spot coil. As mentioned above, the magnetic field generated by the spot coil is intended to cause the cathode to erode more uniformally, thereby maximizing the useful life of the cathode. Prior art electromagnetic spot coils have generally been quite heavy and difficult to install when the source plate assembly is in a vertical orientation, such as illustrated in FIG. 2. Further, such electromagnetic spot coils require separate electrical power supplies and wiring, both of which are subject to failure. Additionally, the electromagnetic spot coil windings have been vulnerable to the high temperatures and abuse to which they are subjected in operative use, causing such windings to short out to the source plate ring and typically required physical removal thereof when performing routing maintenance operations on the assembly.

Another drawback with prior art cathode mounting assemblies has been that the source plate assembly of such structures has typically been bolted to the chamber wall (as illustrated in FIG. 2) in a manner requiring registration of the bolts with the bolt holes prior to final assembly. Such procedure has generally been awkward and time consuming, and requires the assembler to divert his attention from the critical seal elements during the alignment procedure. Further, when the source plate assembly is removed from the chamber, to provide access to the internal cavity of the chamber or to replace the cathode source, the assembly has to be set aside where it can easily be damaged. Bolts and nuts used to secure the source plate assembly can easily be lost or misplaced during the disassembly/assembly process.

The present invention is directed to the aforementioned problems. The insulator and seal member of the prior art devices are replaced by insulator ring and seal construction that is less vulnerable to coating. Such construction decreases the maintenance required and enables the deposition machine to be used for multiple "runs" before the insulator ring need be cleaned or replaced. Likewise, with the configuration of this invention, insulator seals are much less likely to become coated by the source material or to be come operatively damaged by a drifting arc spot. The insulator rings of the present invention also have the advantage of being self-centering, in the sense that they register more readily with the source plate ring and cathode assemblies, and in that they also assist in the self-centering of other components of the source plate assembly. The insulator rings of the present invention are desiged so that they will remain in place once positioned, and do not fall from or out of grooves as have the O-ring seals of prior art devices. The insulator rings of the present invention thereby reduce the "down time" attributable to maintenance, facilitate cathode source replacement and allow for faster multiple-cycling time of the deposition machine.

The present invention also replaces the electromagnetic spot coil of prior art designs with a compact simple permanent magnet structure that alleviates the problems associated with such unreliable prior art structures. The source plate assembly of the present invention is better cooled, so as to resist agglomeration of the coating source plasma particles. In a preferred embodiment of the present invention, the loose bolts and nuts formerly used to interconnect the chamber wall and source plate assemblies have been eliminated, further minimizing the amount of time required to reassembly the source plate assembly prior to operation of the deposition machine. These and other advantages of the invention will become apparent to those skilled in the art, upon a more detailed description of a preferred embodiment of the invention.

SUMMARY OF THE INVENTION

One aspect of the present invention lies in the replacement of the prior art seals and electrical insulator members for separating the chamber wall from the source mounting plate assembly and the source mounting plate from the inner cathode assembly, with resilient insulator seal(s) having at least two surfaces preferably at substantially 90 degrees to one another. A preferred configuration of an insulator seal of the present invention has a generally L-shaped cross-section. The insulator seal of the present invention is directed to the problems mentioned above. To simplify terminology, the insulator seal of the present invention as referred to herein will be henceforth referred to as an "L-ring". It will be clear to those skilled in the art, however, that the insulator seal could have a variety of cross-sectional shapes, the "L-ring" terminology being used to generally refer to a seal configuration having, in cross-section, two arms projecting outwardly from a common point and defining an included angle therebetween. It will also be understood that the "L-ring" terminology is not intended to be limiting in the sense that a circular or "ring" peripheral configuration of the seal is required, but that such a seal could assume any peripheral shape or configuration as dictated by the closed path that is to be sealed.

The L-ring design of this invention has an advantage over the prior art insulator and seal members in that the L-ring can be made fairly thin and recessed in a groove or easily shielded so that it becomes statistically unlikely for particles of the deposition plasma to actually reach and coat the L-ring. Thus, the L-ring need not be scraped or cleaned after every run of the deposition machine, and down time is minimized, enabling faster turn-around time between deposition runs. Further, the L-ring is by its very nature self-centering and when properly sized, has a tendency to remain in place once positioned, and need not be manually held while the source mounting plate assembly is aligned and bolted.

The L-ring design of the present invention also offers advantages over the prior art O-ring configuration that was formerly used to provide an insulating seal between the inner cathode assembly and the source mounting plate. It was noted above that the O-ring was fairly difficult to mount when the source plate assembly was in a vertical orientation. The L-ring of the present invention is self-centering due to its angular shape, and tends to remain in place while the other components of the source plate assembly are being positioned. Further, use of the L-ring configuration according to this invention allows design of the source mounting plate and inner cathode assemby so as to minimize exposure of the L-ring to arc spots that wander off of the cathode surface and migrate down the sides of the cathode support assembly.

As noted above, if the O-ring grooves of prior art device are made too shallow, the O-rings will not remain in place. On the other hand, if such grooves are made too deep a proper seal will not be provided and electrical isolation may be lost. In contrast, the L-ring of the present invention need not be positioned in a groove at all. Due to hoop stresses in the L-ring and its preferably resilient nature, when properly sized it will remain in place without the necessity of a retaining groove. As a result, the L-ring is less likely to collapse.

Therefore, according to one embodiment of the invention, there is provided an insulator seal for an electric arc physical vapor deposition machine electrode mounting assembly comprising an electrical insulator ring of resilient material disposed about a longitudinal axis and having a first segment forming an angle alpha with the longitudinal axis and a second segment, adjacent to the first segment forming an angle beta therewith, wherein the angle beta is an angle other than 0 degrees. According to a preferred construction of the insulator seal, the angle alpha is approximately 0 degrees and the angle beta is approximately 90 degrees. Further, according to a preferred construction of the insulator seal, the first and second segments thereof each is of fairly uniform cross-sectional thickness and has an average thickness dimension when viewed perpendicular to a plane containing the longitudinal axis of the insulator seal. According to a preferred construction of the insulator seal, the second segment of the seal comprises a bulge when viewed in cross-section having a dimension substantially larger than the average thickness dimension of the second segment. Such configuration allows more deformation for a given compression force applied to the insulator seal member, making it easier to effect a seal with the use of a lower compressive force.

According to another aspect of the invention, there is provided an electrode mounting assembly for a physical vapor deposition machine of the type having a chamber wall defining an internal deposition chamber. The mounting assembly includes an outer portion operatively connected to the deposition chamber wall. The outer portion is disposed about a longitudinal axis and has a first surface forming an angle alpha with the longitudinal axis and a second surface adjacent to the first surface and forming an angle beta therewith. The angle beta is an angle other than 0 degrees. The mounting assembly further has an inner portion disposed about a longitudinal axis, has a first surface forming an angle with the inner portion's longitudinal axis which is substantially equal to the angle alpha. The inner portion also has a second surface adjacent to its first surface and forming an angle therewith substantially equal to the angle beta. The mounting assembly further includes an electrical insulator seal disposed about a longitudinal axis and having first and second segments, the first segment forming an angle with the longitudinal seal axis that is substantially equal to the angle alpha, and the second segment being adjacent to the first seal segment and forming an angle therewith substantially equal to the angle beta. The mounting assembly further has means for urging the inner and outer portions toward one another, sandwiching the seal member therebetween such that the longitudinal axes of the inner, the outer, and the seal portions are coaxially aligned. When so aligned, the first seal segment is sealingly engaged between the first surfaces of the inner and outer mounting assembly portions, and the second seal segment is sealingly engaged between the second surfaces of the inner and outer mounting assembly portions. When so assembled, the electrode mounting assembly is operative such that the inner and outer portions thereof can be operatively maintained at different electrical potentials, and the seal member between the inner and outer portions forms both an electrical and vacuum pressure seal therebetween.

According to a preferred configuration of the invention, the angle alpha is approximately 0 degrees and the angle beta is approximately 90 degrees. Further, according to the preferred configuration of the invention, the inner portion of the electrode mounting assembly comprises a cathode assembly and the outer portion includes inner and outer rings configured to cooperatively sandwich a second insulator seal therebetween. The outside ring is operatively connected to the deposition chamber wall, preferably by a pivotal mounting apparatus, and defines first and second seal-engaging surfaces. The first surface forms an angle gamma with the longitudinal axis of the outside ring, and the second surface which is adjacent to the first surface forms an angle delta therewith, wherein the angle delta is other than 0 degrees. The inside ring is preferably disposed about a longitudinal axis and has a first surface forming an angle substantially equal to the angle gamma with its longitudinal axis and a second surface adjacent to its first surface and forming an angle substantially equal to delta therewith. The second insulator seal is similar in construction to the first insulator seal and is an electrical insulator. The second seal has a first segment forming an angle with its longitudinal axis substantially equal to gamma and a second segment adjacent to the first sgement forming an angle substantially equal to delta therewith. Second connection means are provided for urging the inside and outside rings toward one another in a manner such that the longitudinal axes of the inner and outer rings and of the second seal means are substantially coaxially aligned with one another and such that the first segment of the second insulator seal is sealingly engaged between the inside and outside ring first surfaces, and the second segment of the second insulator seal is sealingly engaged between the inside and outside ring second surfaces. As with the first seal configuration, the angles gamma and delta of the second seal configuration are respectively approximately equal to 0 degrees and 90 degrees.

According to a preferred configuration of the invention, the electrode mounting assembly further includes an improved cooling configuration for cooling the inside ring member. As was described above, it is preferable to keep the electrode and chamber surfaces reasonably cool during the deposition process to minimize the amount of agglomeration of plasma particles. The inside ring of the present invention is preferably configured so as to form an internal passageway suitable for accommodating the flow of fluid coolant therethrough, thereby cooling not only the inner ring, but the back surface of the cathode as well. The invention further contemplates a cathode and a magnet coaxially mounted to the cathode assembly, such that the magnet's flux field operatively extends to that region overlying the plasma-producing surface of the cathode. The magnet is compact and light-weight and is preferably in the form of a permanent magnet configured in the shape of a disc or annulus. Such permanent magnet construction eliminates previous shorting problems that heretofore existed with the use of prior art electromagnet assemblies and provides improved operative reliability over such prior art configurations.

The pivotal connection of the outside ring assembly to the chamber wall enables the entire electrode mounting assembly to be swung open to provide ready access to the internal cavity of the deposition chamber and to facilitate maintenance of the assembly. Such feature eliminates the problems discussed above regarding vulnerability of loose pieces of prior art cathode mounting assemblies to loss or damage during maintenance operations.

It will be understood by those skilled in the art, that while the present invention will be described with respect to an electric arc vapor deposition system, the principles and apparatus of this invention apply equally well to other types of physical vapor deposition structures. Further, while the invention will be specifically described with respect to a preferred embodiment configuration of the invention using multiple annular ring type configurations, that the invention is not limited to such configurations, but applies equally well to other geometrically shaped deposition chamber source mounting plate structures. It will be readily appreciated by those skilled in the art that the present invention provides a simple and highly effective seal configuration for sealing and electrically isolating the coating source electrode mounting structure from the primary deposition chamber wall, with a seal configuration which provides effective electrical and physical sealing properties while requiring a minimum of maintenance or care. It will also be appreciated that the present invention provides an improved cathode spot control magnet structure which eliminates the reliability problems heretofore associated with prior art structures. These and other advantages of the invention will become apparent to those skilled in the art upon a more detailed description of the invention.

BRIEF DESCRIPTION OF THE DRAWINGS

FIG. 4 is a perspective view of the source plate mounting assembly of FIG. 3, illustrating the source plate assembly swung open and disengaged from the chamber wall, and portraying the cathode and cathode shield and chamber inner cavity.

FIG. 5 is a front elevational view of the source plate mounting assembly shown in FIG. 3 with connector and hose portions thereof removed for purpose of clarity.

FIG. 6 is an enlarged perspective fragmentary view of the insulator seal portion of the source plate mounting assembly of FIG. 3, illustrating the bulge configuration of the seal.

FIG. 7 is a cross-sectional view of the source plate mounting assembly shown in FIG. 1, generally taken along the Line 7—7 of FIG. 5.

DETAILED DESCRIPTION OF THE INVENTION

Figure 1:
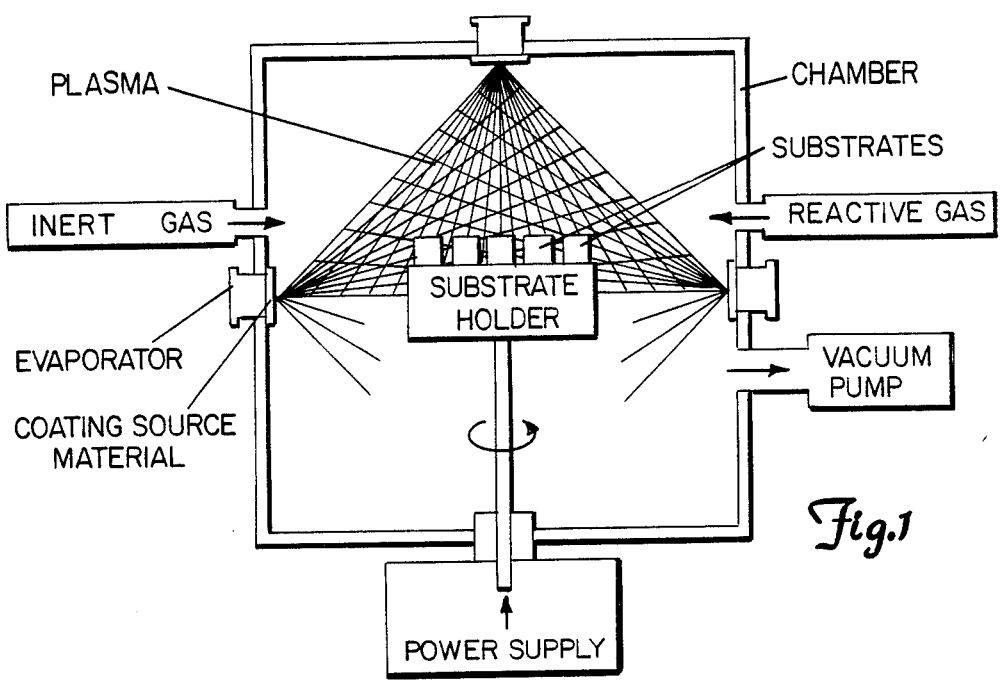
FIG. 1 is a diagrammatic representation of an electric arc physical vapor deposition machine illustrating the use of three coating source assemblies.
Figure 3:
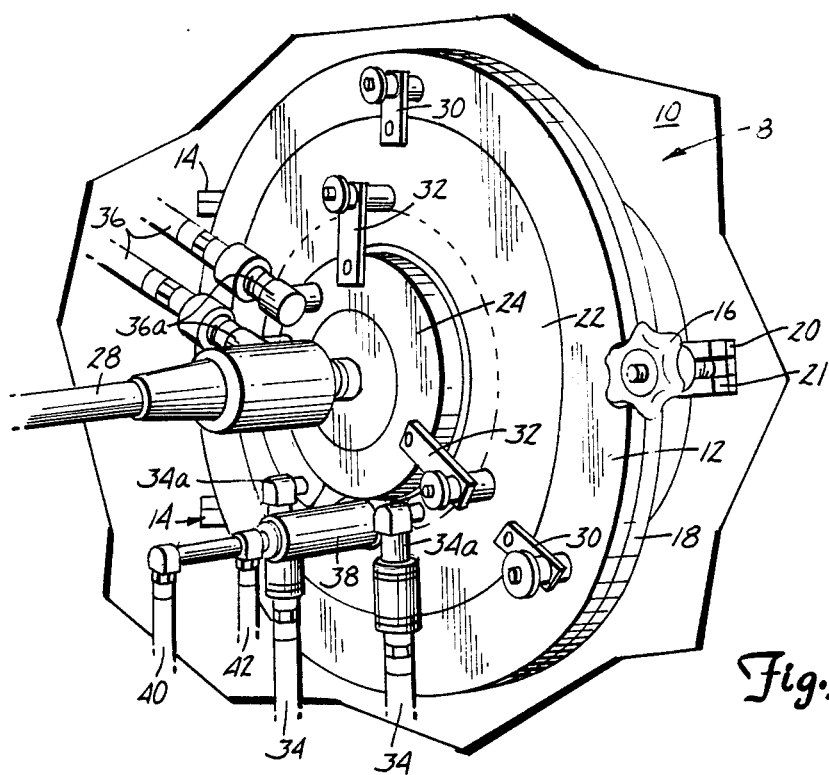
FIG. 3 is a perspective view of a cathode source mounting plate assembly of an electric arc vapor deposition chamber, constructed according to the principles of this invention, illustrating the deposition chamber wall broken away and the hingedly mounted source plate assembly in clamped shut position.
Figure 2:
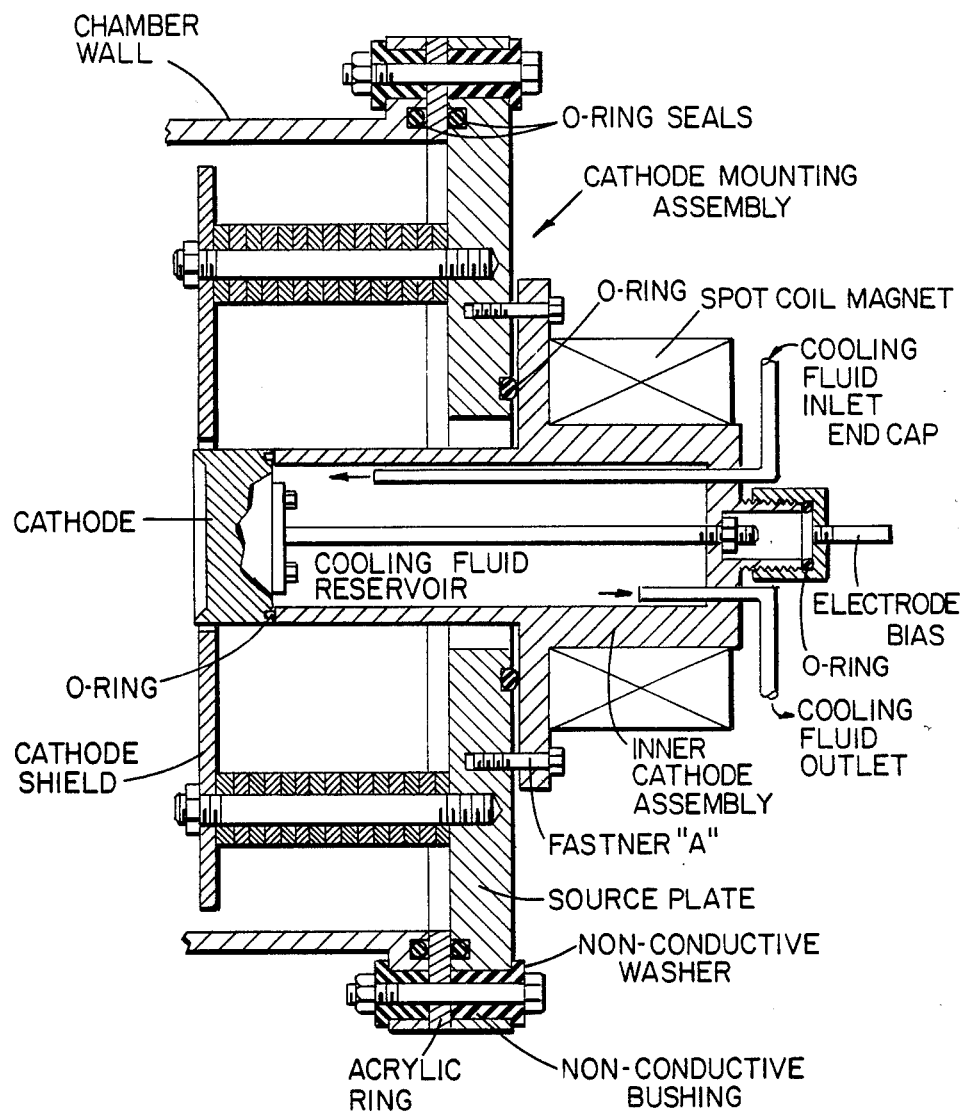
FIG. 2 is a cross-sectional view of a typical prior art coating source mounting plate assembly illustrating acrylic insulation ring and O-ring seal members and a spot coil, as typically arranged and used in prior art electric arc vapor deposition machines.

Referring now to the drawing, wherein like reference numerals denote like elements throughout the several views, FIG. 3 illustrates, in perspective, a preferred embodiment of an electrode coating source mounting assembly 8 constructed according the principles of the present invention. In the embodiment illustrated, the electrode coating source mounting plate assembly 8 is mounted to and forms a part of an electric arc vapor deposition machine, as diagramatically illustrated in FIG. 1. For simplicity and ease of description, the electrode coating source mounting plate assembly 8 will hereinafter be simply referred to as a "source plate assembly". As previously described in the Background section of this specification, the source plate assembly is often referred to by other names as well, as for example the "evaporator" shown in FIG. 1. It should be noted (as diagrammed in FIG. 1) that a typical electric arc vapor deposition machine may have several source plate assemblies mounted in spaced relation with respect to one another in the deposition chamber, to provide, for example, a more uniform film thickness or coverage on a substrate(s), or perhaps to provide a plurality of different coating materials in the coating plasma.

The source plate assembly 8 includes an outside plate ring 12 that is normally in electrical contact and sealing engagement with a chamber flange 18. The chamber flange is affixed, for example welded, to a wall 10 of the deposition chamber. Appropriate seal means (not illustrated) are provided to place the outside plate ring 12 in sealingly engagement with the chamber flange 18 so that a sub-atmospheric pressure may be maintained in the internal cavity of the electric arc deposition chamber, through use of a vacuum pump (see FIG. 1). The outside plate ring 12 effectively provides a framework for the rest of the source plate assembly 8. The outside plate ring 12 is preferably hingedly connected to the chamber wall 10 (FIGS. 4 and 5) by a pair of hinges 14, and is clamped to the chamber wall with a handscrew 16. The source plate assembly 8, as shown in FIG. 3, is positioned as it would be when the deposition machine is operatively coating substrates, (i.e. with the handscrew 16 tightened to provide an electrically conductive and vacuum-tight engagement between the outside plate ring 12 and the chamber flange 18). FIG. 4 shows the handscrew 16 in its loosened state and shows that the handscrew 16 is preferably pivotally mounted to a hand screw yoke 20 so that the handscrew 16 may be swung away from the outside plate ring 12 subsequent to loosening of the handscrew 16. The outside plate ring 12 includes a yoke 21 that is adapted to receive the handscrew 16. Once the handscrew 16 has been loosened and pivoted away from the outside plate ring yoke 21, the outside plate ring 12, and the rest of the movable portion of the source plate assembly 8, may then be pivotally swung away from the chamber flange 18 about the hinges 14 (as shown in FIG. 4) to provide maintenance access to the components mounted to the "internal" side of the door member and to the internal cavity 11 of the chamber.

Referring to FIG. 3, the outside plate ring 12, is illustrated in its preferable, annular configuration. It will be understood, however, that the outside plate 12 could assume other than circular configurations, as can other portions of the source plate assembly 8. In the preferred embodiment, the outside plate ring 12 is coaxially aligned with and supports an inside plate ring 22, which further supports in coaxial alignment a cathode assembly, generally indicated at 24. The cathode assembly 24 includes a cathode 26 as shown in FIG. 4. The cathode 26 generally comprises one source of material which is vaporized to form the coating plasma as discussed above. A cathode cable 28 is electrically connected to the cathode assembly 24. The cable 28 is configured for connection to a power supply (not shown) which biases a cathode with respect to the chamber wall 10, as discussed above and further discussed below. Outside clamps 30 and inside clamps 32, equally spaced about the plate ring assembly 8, secure the inside plate ring 22 to the outside plate ring 12, and secure the cathode assembly 24 to the inside plate ring 22, respectively. The clamps 30 and 32 may be loosened and pivoted to separate the plates 22 and 12 and the cathode assembly 24, to permit access to the insulator seal rings of the present invention, as described below.

The source plate assembly 8 is supplied with cooling means so that the cathode and its surrounding parts may be maintained at a preferred temperature to help prevent droplet formation. Water is the preferred coolant. Quick-disconnect hoses and couplings carry the water coolant for circulation through the inside plate ring 22 and the cathode assembly 24 (described hereinafter in more detail in FIG. 7). In the preferred embodiment, a pair of coolant hoses 34 carry liquid coolant to and from the inside plate ring 22 through couplings 34a, and a pair of coolant hoses 36 carry liquid coolant to and from the cathode assembly 24 through couplings 36a. It should be noted that the pair of hoses 34 and 36 may be interconnected so that there is a single continuous flow path through the inside plate ring 22 and through the cathode assembly 24.

The cathode assembly 8 is adapted to accept a trigger assembly generally designated at 38. In the preferred embodiment, the trigger assembly is pneumatically activated through a pair of pneumatic hoses 40 and 42. The hoses 40 and 42 supply mechanical power to a trigger member 44 (FIG. 4) that is longitudinally movable within the housing of the trigger assembly 38. The trigger member 44 is operatively moved with respect to the cathode 26 as appropriate during the operation of the electric arc deposition machine. The trigger assembly includes in the preferred embodiment, a double acting pneumatic cylinder/piston that enables the trigger 44 to be reciprocally moved in the chamber as needed during the coating process. The piston within the pneumatic assembly 38 is operatively connected to the trigger member 44 such that motion of the piston directly causes movement of the trigger member 44. A more detailed description of such a trigger assembly is provided in U.S. Pat. No. 4,448,799 issued on May 15, 1984 entitled ARC-INITIATING TRIGGER APPARATUS AND METHOD FOR ELECTRIC ARC VAPOR DEPOSITION COATING SYSTEMS, owned by the common assignee of this invention. To the extent that the disclosures of such application are applicable to an understanding of this invention, they are herein incorporated by reference. It should be noted that while a specific type of trigger structure has been described, the source plate assembly 8 may accept any type of appropriate trigger design, and is not limited to the pneumatic trigger assembly 38 of the type described and shown herein.

FIG. 4 illustrates the movable portion of the source plate assembly 8 in its open position as swung about the pair of hinges 14. As discussed above, the outside plate ring 12 is outwardly concentric to the inside plate ring 22 and the two plate rings 12 and 22 are clamped together using the outside clamps 30 as shown in FIG. 3. The inside plate ring 22 acts as a support for a cathode shield 46 (FIG. 4). The cathode shield 46 has cutouts 46a and 46b for the cathode 26 and the trigger member 44 respectively. The cathode shield 46 is supported by a plurality of shield bolts 46 which are threaded into the inside plate ring 22 and locked thereto by lock nuts 49. The shield bolts 48 are preferably threaded along their entire lengths so that the cathode shield 46 may be repositioned along the longitudinal axis of the cathode shield 46, the longitudinal axis being defined as an axis passing through the center of the cathode shield 46 and perpendicular to the generally planar portion of the cathode shield 46. The cathode shield 46 is preferably positioned so that its planar surface is substantially flush with the front surface of the cathode 26 (see FIG. 7). It should be noted that throughout the present application the term "front" refers to a surface facing the interior cavity 11 of the deposition chamber, and the term "rear" refers to a surface facing away from the chamber cavity. Shield nuts 50 on both sides of the shield 46 act to lock the shield 46 in place. The central opening 46a formed by the shield 46 permits the end of the movable trigger member 44 to selectively move into and out of contact with the front face of the cathode during operation of the deposition machine to initiate electric arcs as previously described. The second opening 46b formed by the shield 46, near the periphery of the shield 46, permits the trigger member 44 to be adjustably laterally moved in a direction substantially parallel to the longitudinal axis of the shield 46.

FIG. 5 illustrates the source plate assembly 8 in its closed position, with the hand screw 16 tightened. The hinges 14 are clearly visible in FIG. 5. It is clear from the figures that the hinges 14 may be of very simple construction. In the preferred embodiment, each hinge 14 has an outside plate ring extension 14a and a chamber flange extension 14b preferably welded to the outside plate ring 12 and the chamber flange 18, respectively. The extensions 14a and 14b define aligned holes that accomodate a hinge pin 14c which hingedly interconnects the extensions 14a and 14b. FIG. 5 also clearly illustrates the preferred configuration for the outside clamps 30 and the inside clamps 32, (i.e., equally spaced about the center of the source plate assembly 8, substantially 120° apart).

Referring to FIGS. 5 and 7, the inside plate ring 22 has a cover plate 52 that serves as one wall of the coolant passage (hereinafter described in more detail) within the inside plate ring 22. It should be noted that the coolant hoses 34 and 36, the trigger asseby 38, and the cathode cable 28 have been deleted from the illustration shown in FIG. 5 for the purposes of the present discussion. The cover plate 52, preferably fabricated from 0.25 inch stainless steel, is welded in place. Also illustrated in FIG. 5 is a magnet cover 55 that is annularly shaped to cover and also preferably retainably hold the spot control magnet in position. The cover 55 is in the preferred embodiment formed from stainless steel sheet material but could be of other suitable materials, including magnetic materials. The magnet cover 55 is preferably glued in place with an epoxy. A permanent magnet 54 is confined by the cover 55, as better illustrated in FIG. 7. The permanent magnet 54 is also annularly shaped and is coaxially aligned with the plate rings 12 and 22 and forms a component of the cathod assembly 24. The permanent magnet 54 may be of any magnetized material such as, for example, iron or compounds containing iron. The magnet 54 is preferably coaxially aligned with the cathode 26 for the purposes discussed below.

FIG. 7 shows a cross-sectional view of the source plate assembly 8 as taken along lin 7—7 of FIG. 5. FIG. 7 more clearly illustrates the cooperative mating alignment of the inside and outside plate members 22 and 12 respectively and of the cathode assembly 24 to the inside plate member 22, as well as the operative nature of the outside and inside clamps 30 and 32 respectively. The outside and inside plate rings 12 and 22 respectively have cooperatively mating annular shoulder portions 12a and 22a sized to align with one another when positioned as in FIG. 7. When the outside clamps 30, which are fastened to the outside plate ring 12, are "tightened", they apply an axial force to the inside plate ring 22 which urges the shoulder 22a toward engagement with the shoulder 12a. An insulator seal ring 56 positioned in the gap between the outside and inside plate ring shoulders 12a and 22a is thereby compressed therebetween. The insulator seal ring 56 prevents the plate ring shoulders 12a and 22a from coming into electrical contact with one another and simultaneously forms a vacuum seal between the plate rings 12 and 22.

In similar manner, the cathode assembly 24 and the inner plate assembly 22 define annular shoulder portions 24b and 22b respectively, sized to cooperatively mate with one another when positioned as illustrated in FIG. 7. When the inside clamps 32 are "tightened", they apply an axial force to the cathode assembly 24 which urges the shoulder 24b toward engagement with the shoulder 22b. An insulator seal ring 58 positioned in the gap between the shoulders 24b and 22b is thereby compressed therebetween. The insulator seal rings 56 and 58 are preferably of a resilient material that also forms an electrical insulator. Such insulator seal rings effectively isolate the cathode assembly 24, including the cathode 26, from the chamber wall 10 so that the electric arc deposition machine may function properly.

A washer-shaped spacer 53 is also positioned in loosely sandwiched manner between the shoulder members 24b and 12b, as illustrated in FIG. 7. The spacer 53 is preferably of a polytetrafluoroethylene material such as Teflon ®. The spacer provides further electrical isolation between the cathode assembly 24 and the inner plate ring structure 22. In the preferred embodiment, the insulator seal ring 56 is sized such that when operatively compressably sandwiched between the shoulders 12a and 22a defines a first gap 57 therebetween. In the preferred embodiment, the gap 57 is approximately 0.030 inches. Similarly, the insulator seal ring 58 defines a second gap 59 between the shoulders 24b and 22b, which in the preferred embodiment is approximately 0.030 inches, but may be as large as 0.050 inches. The gaps 57 and 59 thus defined, are still appoximately an order of magnitude smaller than those of the prior art. As a result, coating plasma particles within the chamber 11 are substantially unable to traverse the long narrow gaps (57 and 59) so as to harmfully coat the spacer 53 or the seal members 56 and 58. The spacer also protects the seal member 58 from damage caused by arc spots that may wander down the side of the cathode and traverse the gap 59, by extinguishing such spots, thereby preventing further advance of the spot(s) toward the seal member 58.

Referring to FIG. 7, the cathode shield 46 lies preferably substantially flush with the front face of the cathode 26 and is supported by the plurality of shield bolts 48 as discussed above. The cathode assembly has a lower housing 60 that serves as the support base for the cathode 26. The cathode support 60 is preferably fabricated from stainless steel plate stock. The cathode support 60 is bored and threaded to accommodate a threaded engagement connection of the cathode cable 28 in its back surface. On its front surface, the cathode support 60 has an internally threaded hole that accommodates one end of a cathode mounting stud 62. The other end of the mounting stud 62 threads into the back of the cathode 26 and holds the cathode 26 in place against the cathode support 60 as below described.

The cathode support 60 also includes an annular extended portion 66 which protrudes through a center hole 22c concentrically formed in the inside plate ring 22. The center hole surface 22c and the external surface of the extended portion 66 cooperatively define therebetween the gap 59, as previously discussed. The extended portion 66 includes an O-ring groove 68 formed at its frontmost surface, designed to accommodate an O-ring 70 which permits the cathode 26 to be held in fluid-tight engagement against the extended portion 66 of the cathode support 60. The upper edge of the extended portion 66 has a plurality of notches 68a formed therethrough and opening into the O-ring groove 68 through which liquid coolant can move from the O-ring groove 68 to the interior of the cathode support 60 and back again, thereby cooling the O-ring 70 and extending its useful life.

The "back" surface of the cathode support 60 is recessed to cooperatively hold the magnet 54 and the magnet cover 55. As noted above, in the preferred embodiment the magnet cover 55 is of a relatively thin sheet stock material and is attached to the cathode support 60 by an adhesive such as epoxy. The cathode support 60 is also bored and milled to form a pair of fluid passages 64 opening into a reservoir formed within the cathode support portion 66. The fluid passages 64 are connected with the coolant hoses 36 and carry cooling fluid past and into engagement with the rear surface of the cathode 26. While water is used as the coolant in the preferred embodiment, other suitable coolant materials could also be used. Such cooling is needed because of the excessive temperatures caused by the arcing process on the front surface of the cathode 26 which would, in the absence of cooling of the cathode assembly 24, tend to melt the O-ring seal engaging the cathode, and cause excessive droplet formation.

As illustrated in FIG. 7, the inside plate ring 22 is also milled to define an internal coolant passage 23 that is supplied with fluid coolant via the inside plate ring coolant hoses 34. The outer cover 52 is welded overlying the passage 23, to form a closed coolant passageway within the inside plate ring. Cooling of the inside plate ring 22 assists the direct cooling provided to the rear surface of the cathode 26, as previously discussed. The O-ring life is thereby extended and droplet formation during the deposition process is mitigated to an even greater degree.

The coolant hose couplings 34a are in the preferred embodiment threadedly connected to the cover plate 52 of the inside plate ring 22 as best illustrated in FIG. 7. Similarly, the coolant hose couplings 36a are threadedly fastened to the cathode assembly support member 60. It will be understood that while a threaded configuration has been illustrated, that other modes of connection could equally well be used.

With reference to the figures described above, operation of the source plate assembly 8 as a component of the electric arc deposition machine can now be discussed. The general technique of electric arc vapor deposition is well known in the art and need not be discussed herein. Only the source plate assembly 8 will be discussed in detail.

The source plate assembly 8, is illustrated in FIG. 3, in its operational state. When so positioned the inner deposition chamber can be evacuated down to an appropriate pressure, typically on the order of $2 \times 10^{-5}$ Torr. It will be understood that the present invention will, however, allow evacuation of the chamber to even lower pressures of approximately $10^{-6}$ Torr. That is, the hand screw 16 is tightened so that the outside plate ring 12 is in sealing and electrical contact with the chamber flange 18. The inside plate ring 22 is electrically isolated from the outside plate ring, 12 since the outside insulator seal ring 56 acts as an insulator between the plate rings 12 and 22. As shown in FIG. 7, the outside insulator ring 56 is preferably L-shaped. This shape permits the outside insulator seal ring 56 to, in effect, "locate" within outside plate ring 12 and grip the other circumferential edge of the inside plate ring 22 prior to assembly of the plate rings 12 and 22. The outside insulator seal ring 56 will therefore retain its position once placed in the "channel" formed by the inside shoulder 12a of the outside plate ring 12 such that a single operator may assemble and disassemble the source plate assembly 8 without requiring a second operator to hold the insulator seal ring 56.

As previously described, the outside and inside insulator seal rings, 56 and 58 respectively, are separated from the inside of the deposition chamber cavity 11 by the narrow elongate channels 57 and 59. In the case of seal 56, the narrow channel gap 57 effectively prevents plasma particles from reaching and coating the seal 56, thereby significantly increasing its operative life and reliability of the system. The seal 58 is effectively blocked from coating by plasma particles not only by the narrow channel gap 59, but also directly by the teflon spacer 53 which also prevents wandering cathode spots from reaching and damaging the seal 58. Therefore, the configuration insures seal integrity of the system over extended periods of operative use.

An enlarged perspective fragmentary view of a preferred L-shaped configuration of the outside and inside insulator seal rings 56 and 58, is illustrated in FIG. 6. Referring thereto, it will be noted that one of the legs or sections of the insulator ring includes a "bulge" 61. The bulge enhances the sealing capacity of the seal member by providing a thicker cross-sectional area that can be compressed between the members that are to be sealed together. It should be noted that the bulge 61 need not necessarily occur at the center of one of the sections of the insulator rings 56 and 58 as shown in FIG. 6, but could just as well be positioned more near one edge of the section. Further, the bulge 61 need not have a circular cross-section as shown in FIG. 6. Though not shown in FIG. 7, the bulge portion 61 of the insulator seal rings 56 or 58 should preferably be positioned on that leg or section of the insulator seal ring that is disposed substantially perpendicular to the longitudinal axis of the source plate assembly 8. In this regard, it should be noted that the plate rings 12 and 22, the cathode 26, the magnet 54, and other components of the source plate assembly 8 all have their longitudinal axes substantially coaxially aligned, when the source plate assembly 8 is in its assembled state as shown in FIG. 7. It will be understood that the longitudinal axis of each such component generally lies at the center of the component and passes substantially perpendicular to a plane that is parallel to either the rear surface or the front surface of the component. It should also be noted that although the insulator seal rings 56 and 58 are shown in FIG. 7 as having an L-shaped configuration, the segments forming each insulator seal ring 56 and 58 need not necessarily be oriented perpendicular to one another. It will also be understood that the present invention contemplates that the insulator seal rings could have more complex shapes but yet include a substantially L-shaped section. The insulator seal rings 56 and 58 are preferably made of a resilient material having a reasonably large electrical resistivity. Further, the rings 56 and 58 should preferably be resistant to accelerated aging effects caused by repeated heating and cooling. Those skilled in the art of gasket and O-ring design will understand that any number of, for example, rubber compositions will fulfill the requirements specified above.

The cathode 26 is threadedly engaged by the cathode stud 62 which is further threaded into the cathode support member 60. The O-ring 70 provides a seal around the periphery of the back of the cathode so that coolant supplied to the rear surface of the cathode 26 will not leak into the deposition chamber cavity.

With regard to the permanent magnet 54, it is preferably annularly shaped as shown in FIG. 7. Such shape creates a more uniform magnetic field on the front face of the cathode 26, to better control movment of the cathode spot as discussed above. In the preferred embodiment, the magnet 54 preferably generates a magnetic field parallel to the longitudinal axis of the cathode 26 equal to approximately 15 Gauss at the front face of the cathode 26.

The pneumatic trigger assembly 38 and its operation in the electric arc deposition machine was discussed above. Typically, a 4-way directional control valve (not shown) would be connected to the pneumatic hoses 40 and 42 and further connected to a source of pressurized air at the third port and ambient air at the fourth port. Manipulation of the 4-way valve causes the hoses 40 and 42 to alternately pressurize and vent to cause the piston within the trigger assembly 38 to reciprocate, thus causing the trigger 44 to move in a manner so as to initiate an arc.

Subsequent or prior to the coating run, the source plate assembly 8 may be pivoted away from the chamber wall 10 and the flange 18 after the hand screw 16 is loosened and swung away on its pivot, hand screw yoke 20. In this position, the electrode (i.e. cathode 26) may be easily replaced by simply unscrewing the spent electrode and threading in its replacement. The replacement could have its own cathode stud 62 or utilize the cathode stud 62 of the worn cathode 26. Other routine chamber maintenance, as well as handling of the substrates being coated, can also be performed through the access port to the internal cavity that is formed by the "open" source plate 8.

Throughout the coating process, a fluid coolant, typically water, is allowed to flow through the inside plate ring passage 23 as defined by the cover plate 52 and the inside plate ring 22, and through the passages 64 in the cathode support 60 so that the cathode 26 and parts proximate to the cathode 26 can be more effectively cooled, thereby limiting droplet formation and increasing the operative life of the adjacent O-ring seals.

It should again be emphasized that the invention is not limited to a particular type of cathode 26, cathode shield 46, trigger mechanism 38, or other such basic components of an electric arc vapor deposition machine. The invention is specifically directed to an improved insulator/seal means for the chamber, to an improved cooling design, to an improved magnet 54 configuration for spot control, and to the simplified construction that enables ease of maintenance provided by, for example, hinged operation of the source plate assembly 8.

Numerous characteristics and advantages of the invention have been set forth in the foregoing detailed description. It will be understood, of course, that this disclosure is in many respects only illustrative. Other modifications of the invention will become apparent to those skilled in the art in light of the foregoing description. This description is intended to provide specific examples of an embodiment which clearly distinguish and disclose the present invention. Accordingly, the invention is not limited to the described embodiment, or to the use of specific elements or techniques described herein. Changes may be made in details, particularly in matters of shape, size, and arrangement of parts without exceeding the scope of the invention. The scope of the invention is defined in the language in which the appended claims are expressed.

I claim:

1. A consumable electrode mounting assembly for a physical vapor deposition machine of the type having a chamber wall defining an internal deposition chamber, comprising:
   (a) an outer portion operatively connected to the chamber wall and disposed about a longitudinal axis and having a first surface forming an angle alpha with said longitudinal axis and a second surface adjacent to said first surface and forming an angle beta therewith, said angle beta being an angle other than 0°;
   (b) an inner portion being disposed about a longitudinal axis and having a first surface forming an angle substantially equal to said angle alpha with said inner portion longitudinal axis, and a second surface adjacent to said inner portion first surface and forming an angle substantially equal to said angle beta therewith;
   (c) an electrically insulating seal disposed about a longitudinal axis and having a first segment forming an angle substantially equal to said angle alpha with said seal longitudinal axis and a second segment adjacent to said first segment and forming an angle substantially equal to said angle beta therewith;
   (d) means for urging said inner and said outer portions toward one another, wherein said inner, said outer and said seal longitudinal axes are subsantially coaxially aligned such that said first seal segment provides an electrically insulating seal and is engaged between said inner and said outer portion first surfaces and said second seal segment provides an electrically insulating seal and is engaged between said inner and said outer portion second surfaces; and
   (e) means for operatively shielding said insulating seal from the internal deposition chamber when said seal is operatively mounted between said inner and outer portions, wherein said seal is protected from direct exposure to conductive coating particles moving within the deposition chamber; whereby said inner and said outer portions can be operatively maintained at different electrical potentials and whereby said mounting assembly resists leaks between said inner and said outer portions when a differential fluid pressure is placed across said mounting assembly.

2. The electrode mounting assembly as recited in claim 1, wherein said outer portion includes means for hingedly connecting said outer portion to the chamber wall, whereby said electrode mounting assembly can be pivotally swung away from the chamber wall to permit access to the interior of the deposition chamber and access to those surfaces of said electrode mounting assembly that operatively address the interior of said chamber.

3. The electrode mounting assembly as recited in claim 1, wherein said angle alpha is approximately 0°.

4. The electrode mounting assembly as recited in claim 3, wherein said angle beta is approximately 90°.

5. The electrode mounting assembly as recited in claim 1, wherein said inner portion comprises a cathode assembly.

6. An electrode mounting assembly for a physical vapor deposition machine of the type having a chamber wall defining an internal deposition chamber, comprising:
   (a) an outer portion operatively connected to the chamber wall and disposed about a longitudinal axis and having a first surface forming an angle alpha with said longitudinal axis and a second surface adjacent to said first surface and forming an angle beta therewith, said angle beta being an angle other than 0°;
   (b) an inner portion comprising a cathode assembly and being disposed about a longitudinal axis and having a first surface forming an angle substantially equal to said angle alpha with said inner portion longitudinal axis, and a second surface adjacent to said inner portion first surface and forming an angle substantially equal to said angle beta therewith;

(c) an electrically insulating seal being disposed about a longitudinal axis and having a first segment forming an angle substantially equal to said angle alpha with said seal longitudinal axis and a second segment adjacent to said first segment and forming an angle substantially equal to said angle beta therewith;

(d) means for urging said inner and said outer portions toward one another, wherein said inner, said outer and said seal longitudinal axes are substantially coaxially aligned such that said first segment is sealingly engaged between said inner and said outer portion first surfaces and said first segment is sealingly engaged between said inner and said outer portion second surfaces; whereby said inner and said outer portions can be operatively maintained at different electrical potentials and whereby said mounting assembly resists leaks between said inner and said outer portions when a differential fluid pressure is placed across said mounting assembly; and (e) wherein said outer portion comprises:
(i) an outside ring operatively connected to the chamber wall and disposed about a longitudinal axis, said outside ring having a first surface forming an angle gamma with its longitudinal axis and a second surface adjacent to its first surface and forming an angle delta therewith, said angle delta being an angle other than 0°;
(ii) an inside ring disposed about a longitudinal axis and having a first surface forming an angle substantially equal to angle gamma with its longitudinal axis and a second surface adjacent to its first surface and forming an angle substantially equal to angle delta therewith;
(iii) a second insulator seal disposed about a longitudinal axis, said second insulator seal being an electrical insulator and having a first segment forming an angle with said longitudinal axis of said second insulator seal substantially equal to angle gamma and a second segment adjacent to said first segment thereof and forming an angle substantially equal to angle delta therewith, and
(iv) second means for operatively urging said inside and outside rings toward one another in a manner such that said first segment of the second insulator seal is sealingly engaged between said inside and outside ring said first surfaces and said second segment of said second insulator seal is sealingly engaged between said inside and said outside ring said second surfaces; whereby said second insulator seal forms a vacuum-tight seal between said inside and said outside rings.

7. The electrode mounting assembly as recited in claim 6, wherein said outside ring includes means for hingedly connecting said outer portion to the chamber wall; whereby said electrode mounting assembly can be pivotally swung away from the chamber wall to permit access to the interior of the chamber formed by the chamber wall.

8. The electrode mounting assembly as recited in claim 6, wherein said angle gamma is approximately 0°.

9. The electrode mounting assembly as recited in claim 8, wherein said angle delta is approximately 90°.

10. The electrode mounting assembly as recited in claim 9, wherein said electrode mounting assembly further comprises means for operatively cooling said inside ring.

11. The electrode mounting assembly as recited in claim 10, wherein said inside ring is configured to form an internal passageway, said internal passageway being suitable for accommodating the flow of a fluid coolant therethrough.

12. The electrode mounting assembly as recited in claim 11, wherein said cathode assembly comprises a cathode of a material to be deposited by the vapor deposition machine, and wherein said inside ring includes shield means operatively positioned in substantially coaxial alignment with said cathode for maintaining a cathode spot on a selected surface of said cathode.

13. The electrode mounting assembly as recited in claim 12, further comprising a magnet magnetically coupled to said cathode and operatively coaxially aligned with said cathode.

14. The electrode mounting assembly as recited in claim 13, wherein said magnet is a permanent magnet.

15. The electrode mounting assembly as recited in claim 14, wherein said permanent magnet is generally configured in the shape of an annulus.

16. The electrode mounting assembly as recited in claim 6, wherein the longitudinal axes of said inner and outer rings and of said second seal means are substantially coaxially aligned with one another.

17. An electrode mounting assembly for an electric arc physical vapor deposition machine of the type having a chamber wall for operating at a first potential, said mounting assembly comprising:

(a) an outside ring operatively connected to the chamber wall and disposed about a longitudinal axis, said outside ring having a first surface substantially parallel to its longitudinal axis and a second surface adjacent to said first surface and substantially perpendicular thereto;

(b) an inside ring disposed about a longitudinal axis, and having a first surface substantially parallel to its longitudinal axis, a second surface adjacent to said first surface and substantially perpendicular thereto, a third surface substantially parallel to said inside ring longitudinal axis and a fourth surface adjacent to said third surface and substantially perpendicular thereto;

(c) an outside insulator seal of electrical insulator material disposed about a longitudinal axis and having a first segment substantially parallel to said outside seal longitudinal axis and a second segment adjacent to said first outside seal segment and substantially perpendicular thereto;

(d) a cathode assembly for operating at a second potential different from said first potential, said cathode assembly having a cathode, disposed about a longitudinal axis, a first surface substantially parallel to said cathode axis and a second surface adjacent to said first surface of said cathode and substantially perpendicular thereto;

(e) an inside insulator seal of electrical insulator material disposed about a longitudinal axis and having a first segment substantially parallel to said inside seal longitudinal axis and a second segment adjacent to said first inside seal segment and substantially perpendicular thereto;

(f) first means for urging said cathode assembly toward and into substantial coaxial alignment with said inside ring, wherein said inside insulator seal first segment is operatively engaged between said inside ring third surface and said cathode assembly first surface, and said inside insulator seal second segment is sealingly engaged between said inside ring fourth surface and said cathode assembly second surface; and (g) second means for urging said inside ring toward and into substantial coaxial alignment with said outside ring, wherein said outside seal first segment is operatively engaged between said first surfaces of said inside and said outside rings and said outside seal second segment is sealingly engaged between said second surfaces of said inside and said outside rings; whereby said cathode can be maintained at said second potential different from said first potential and said mounting assembly resists leaks therethrough when a differential fluid pressure is placed across said mounting assembly.

18. The electrode mounting assembly as recited in claim 17, wherein said outside ring includes means for hingedly connecting said outside ring to the chamber wall, whereby said mounting assembly can be pivotally swung away from the chamber wall to permit access to the interior of the chamber formed by the chamber wall and maintenance of the mounting assembly.

19. The electrode mounting assembly as recited in claim 18, wherein said outside and said inside insulator seals comprise a resilient material and are substantially L-shaped in cross section and wherein said first and said second segments of said insulator seal rings each have a first average cross-sectional thickness prior to being sealingly engaged and a second average cross-sectional thickness after being sealingly engaged.

20. The electrode mounting assembly as recited in claim 19, wherein said second members of said insulator seals each comprise a bulge prior to being sealingly engaged, as viewed in cross section, each of said bulges having a cross-sectional thickness dimension relatively larger than said respective first average thickness.

21. The electrode mounting assembly as recited in claim 1, wherein said inner and said outer portions comprise said means for shielding said insulating seal from the deposition chamber.

* * * * *

UNITED STATES PATENT AND TRADEMARK OFFICE
CERTIFICATE OF CORRECTION

PATENT NO. : 4,556,471

DATED : December 3, 1985

INVENTOR(S) : Clark Bergman, et al

It is certified that error appears in the above-identified patent and that said Letters Patent is hereby corrected as shown below:

In column 1, line 63, "art" should be --arc--.

In column 2, line 24, ($n_2$) should read --($N_2$); and in line 63, "a" should read --as--.

In column 3, line 35, "a" should read --as--; and in line 41, "provided" should read --provides--.

In column 4, line 41, "typically" should read --typical--.

In column 5, line 6, "slide" should read --side--; in line 7, the first comma should be deleted; and in line 44, "routing" should read --routine--.

In column 6, line 3, "be come" should read --become--; in line 10, "desiged" should read --designed--; and in line 16, "time" should read --times--.

In column 7, line 22, "device" should read --devices--.

In column 12, line 32, "46" should read --48--.

In column 13, line 9, "assebly" should read --assembly--; and in line 31, "lin" should be replaced by -- a line--.

UNITED STATES PATENT AND TRADEMARK OFFICE
CERTIFICATE OF CORRECTION

PATENT NO. : 4,556,471

DATED : December 3, 1985

INVENTOR(S) : Clark Bergman et al.

It is certified that error appears in the above-identified patent and that said Letters Patent is hereby corrected as shown below:

Column 15, line 49, "other" should read -- outer --.

Signed and Sealed this

Twenty-seventh Day of May 1986

[SEAL]

Attest:

Attesting Officer

DONALD J. QUIGG

Commissioner of Patents and Trademarks